US006785875B2

(12) United States Patent
Beerel et al.

(10) Patent No.: US 6,785,875 B2
(45) Date of Patent: Aug. 31, 2004

(54) METHODS AND APPARATUS FOR FACILITATING PHYSICAL SYNTHESIS OF AN INTEGRATED CIRCUIT DESIGN

(75) Inventors: Peter Beerel, Encino, CA (US);
Andrew Lines, Calabasas, CA (US);
Qing Wu, Irvine, CA (US)

(73) Assignee: Fulcrum Microsystems, Inc., Calabasas Hills, CA (US)

( * ) Notice: Subject to any disclaimer, the term of this patent is extended or adjusted under 35 U.S.C. 154(b) by 0 days.

(21) Appl. No.: 10/354,272

(22) Filed: Jan. 28, 2003

(65) Prior Publication Data

US 2004/0034844 A1 Feb. 19, 2004

Related U.S. Application Data

(60) Provisional application No. 60/404,359, filed on Aug. 15, 2002.

(51) Int. Cl.[7] .............................. G06F 9/45; G06F 17/50
(52) U.S. Cl. ................................. 716/6; 716/8; 716/10; 703/19
(58) Field of Search ........................ 713/14, 500; 716/1, 716/2, 4, 5, 6, 8, 10, 17, 18; 714/724; 368/113; 365/230.06; 250/396 R; 327/379, 264, 172, 157, 112, 108; 326/98, 96, 83, 30, 27, 17, 16, 108

(56) References Cited

U.S. PATENT DOCUMENTS

| | | | | |
|---|---|---|---|---|
| 5,469,367 A | * | 11/1995 | Puri et al. ...................... | 716/18 |
| 5,493,505 A | * | 2/1996 | Banerjee et al. ............... | 716/18 |
| 5,519,344 A | * | 5/1996 | Proebsting .................... | 327/108 |
| 5,553,276 A | * | 9/1996 | Dean ........................... | 713/500 |
| 5,568,062 A | * | 10/1996 | Kaplinsky ..................... | 326/27 |
| 5,790,415 A | * | 8/1998 | Pullela et al. .................. | 716/6 |
| 6,023,568 A | * | 2/2000 | Segal ............................ | 716/6 |
| 6,131,182 A | * | 10/2000 | Beakes et al. .................. | 716/8 |
| 6,195,787 B1 | * | 2/2001 | Yokoyama ..................... | 716/8 |
| 6,216,255 B1 | * | 4/2001 | Ito et al. ......................... | 716/6 |
| 6,226,774 B1 | * | 5/2001 | Sawasaki et al. ............... | 716/1 |
| 6,263,478 B1 | * | 7/2001 | Hahn et al. .................... | 716/10 |
| 6,397,170 B1 | * | 5/2002 | Dean et al. .................... | 703/14 |
| 6,591,407 B1 | * | 7/2003 | Kaufman et al. ............. | 716/10 |
| 2003/0146773 A1 | * | 8/2003 | Bobba et al. .................. | 326/30 |

OTHER PUBLICATIONS

Mein–Lin et al., "A new approach for checking the unique state coding property of sig transition graphs", Mar. 1992, Design automation, European conference, pp.: 312–321.*

Yu et al., "A New Approach for Checking the Unique State Coding Property of Signal Transition Graphs", Mar. 1992, Design automation, European conference, IEEE, pp. 312–321.

Alain J. Martin, *Erratum: Synthesis of Asynchronous VLSI Circuits*, Mar. 22, 2000, Department of Computer Science California Institute of Technology, Pasadena, California, pp. 1–143.

Andrew Matthew Lines, *Pipelined Asynchronous Circuits*, Jun. 1995, revised Jun. 1998, pp. 1–37.

* cited by examiner

*Primary Examiner*—A. M. Thompson
*Assistant Examiner*—Helen Rossoshek
(74) *Attorney, Agent, or Firm*—Beyer Weaver & Thomas, LLP

(57) ABSTRACT

Methods and apparatus are described for facilitating physical synthesis of an integrated circuit design. A set of paths between observable nodes in a netlist representing the circuit design is generated. Each path corresponds to a sequence of signal transitions. Transistors represented in the netlist are sized to attempt to meet a delay constraint for each path. The delay constraint corresponds to a unit delay times the number of signal transitions in the corresponding path. A plurality of individual delays of different durations are allocated among the transitions for at least one of the paths to meet the delay constraint. At least one of the individual delays exceeds the unit delay.

99 Claims, 6 Drawing Sheets

*SizingPathGeneration*(set1)

foreach leaf cell cella in set1 find all the half-operators in cella that are going to start a path, put in seta foreach half-operator hoa in seta lsta is an empty list of half-operators

RecursivePaths(lsta, hoa)

*RecursivePaths*(lst1, ho1)

If (lst1 contains ho1) make sizing-path from lst1, then return     // found cycle If (ho1 drives an observable point) make sizing-path from lst1 and ho1, then return foreach hoa that is driven by ho1 and has opposite driving direction of ho1

RecursivePaths(lst1+ho1, hoa)

Fig. 2

*CatPathGeneration*(set1)

lsta is sorted list of mid-level cells in set1, from low to high (e.g. from mid to top levels)

foreach cella in lsta

// N.B. an nonobservable sucells is a subcell which contains

// a nonobservable point pop up paths from nonobservable subcells of cella to cella find all the paths in cella that are going to start a cat-path, put in seta foreach patha in seta lsta is an empty list of paths RecursiveCatPaths(lsta, patha)

*RecursiveCatPaths*(lst1, path1)

if (lst1 contains path1) make cat-path from lst1, then return    // found cycle if (last half-operator of path1 drives an observable point)

make cat-path from lst1 and path1, then return foreach patha that is driven by path1

RecursiveCatPaths(lst1+path1, patha)

METHODS AND APPARATUS FOR FACILITATING PHYSICAL SYNTHESIS OF AN INTEGRATED CIRCUIT DESIGN

RELATED APPLICATION DATA

The present application claims priority from U.S. Provisional Patent Application No. 60/404,359 entitled P2N SIZING TOOL—PATH BASED SIZING filed on Aug. 15, 2002, the entire disclosure of which is incorporated herein by reference for all purposes.

BACKGROUND OF THE INVENTION

The present invention relates generally to the design of integrated circuits and, more specifically, to software tools for sizing various elements of an integrated circuit design.

In general, the problem of transistor sizing in an integrated circuit design may be stated as follows: given an initial circuit and floor planning (i.e., geometry) information, generate an improved circuit by changing transistor widths such that the improved circuit meets delay constraints, and minimizes objective functions, e.g., energy dissipation or area. A conventional approach to determining transistor sizes in an unsized asynchronous circuit assumes that every gate has the same delay, i.e., the unit delay model. However, forcing a unit delay model on a circuit may not result in a very good circuit in that some gates are fundamentally more difficult or slower than other gates.

Most commercial sizing tools are intended for synchronous circuit design and are characterized by limitations specific to the synchronous domain which make them virtually unworkable in an asynchronous design flow. For example, most sizing tools measure logic delay from latch to latch, i.e., consequently they generally expect only acyclic circuit paths. As a result, these tools have difficulty dealing with paths that loop back on themselves. They include only ad-hoc techniques to cut loops that often produce inferior paths that are hard to size. This can be an irritating problem for the relatively rare instances of such loops in synchronous circuits, and an overwhelming obstacle for asynchronous designs in which such loops, e.g., handshaking loops, predominate.

In addition, most commercial sizing tools assume that only combinational logic (e.g., NAND gates, inverters, and NOR gates) is used, and thus do not typically support dynamic logic (e.g., domino logic). They are also limited to circuits that are flattened. Thus they are solving an instance-based problem with is not applicable to a hierarchical design. In addition, commercial sizing tools size circuit on the basis of gates, i.e., the pull-up network and pull-down network are sized as one variable, which limits the optimization space. Finally, most commercial sizing tools allow only a small number of primitives that are fixed in size and characterized in advance, thus limiting the available options in creating and solving the optimization problem.

It is therefore desirable to provide tools for use in the design of integrated circuits which address some or all of the aforementioned issues.

SUMMARY OF THE INVENTION

According to the present invention, methods and apparatus are provided for facilitating physical synthesis of an integrated circuit design. A set of paths between a set of observable nodes in a netlist representing the circuit design is generated. Each path corresponds to a sequence of signal transitions. According to a specific embodiment, a signal transition has two types a downward transition in which the signal transitions from logical 1 to 0, and a upward transition in which the signal transitions from logical 0 to 1. Transistors represented in the netlist are sized to attempt to meet a delay constraint for each path. The delay constraint corresponds to a unit delay times the number of signal transitions in the corresponding path. A plurality of individual delays of different durations are allocated among the transitions for at least one of the paths to meet the delay constraint. At least one of the individual delays meets or exceeds the unit delay. According to various embodiments, an objective function is minimized subject to the delay constraints, the objective function relating to the unit delay and a measure of energy consumption. According to various embodiments, amortization of the delay constraint in this manner is applied to an asynchronous circuit design characterized by an asynchronous handshake protocol. According to some of these embodiment, the asynchronous circuit design is a hierarchical design.

According to another specific embodiment, the netlist includes representations of a plurality of leaf cells each having at least one input port and at least one output port. In this embodiment, at least a portion of the set of paths is generated by traversing each leaf cell from the input to output ports to identify at least one of the paths associated therewith. According to one embodiment, the input and output ports for the leaf cells correspond to a subset of the observable nodes. In a further embodiment, at least a portion of the set of paths is generated by concatenating selected ones of the paths (e.g., by making some ports non-observable).

According to another specific embodiment, path generation results for a first instance of a particular leaf cell type are applied to at least one other instance of the particular leaf cell type.

According to a specific embodiment, the delay of each transition is determined by the size of the transistors in the pull up half operator in the case of a rising transition and a pull down half operator in the case of a falling transition. In this embodiment, the transistors associated with the pull up and pull down half operators for a given node are sized independently. According to a more specific embodiment, each of the individual delays are determined with reference to a delay model for each of the pull up and pull down half operators for each of the gates in each path, and wires between the nodes. According to an even more specific embodiment, the delay model represents each half operator as a resistor, a load on the corresponding node as a capacitor, and a wire connecting the half operator and the load as a wire π model. According to yet another specific embodiment, the individual delays are determined with reference to wire length data derived from actual geometry information corresponding to the circuit design.

According to another embodiment, methods and apparatus are provided for facilitating physical synthesis of an integrated circuit design. A set of paths is generated from a netlist representing the circuit design. Each path corresponds to a sequence of nodes each having upward and downward signal transitions associated therewith. For each of selected nodes, the corresponding upward transition is represented by a pull up half operator and the corresponding downward transition is represented by a pull down half operator. Transistors represented in the netlist are sized to attempt to meet a delay constraint for each path. Transistors associated with the pull up half operator for each selected node are sized independently from transistors associated with the corresponding pull down half operator. According to various embodiments, this method is applied to an asynchronous circuit design characterized by an asynchronous handshake protocol. According to some of these embodiment, the asynchronous circuit design is a hierarchical design.

A further understanding of the nature and advantages of the present invention may be realized by reference to the remaining portions of the specification and the drawings.

BRIEF DESCRIPTION OF THE DRAWINGS

FIG. 2 provides pseudo-code representing an exemplary embodiment of an intracell path generation algorithm.

FIG. 4 provides pseudo-code representing an exemplary embodiment of a path concatenation algorithm.

DETAILED DESCRIPTION OF SPECIFIC EMBODIMENTS

Figure 1:
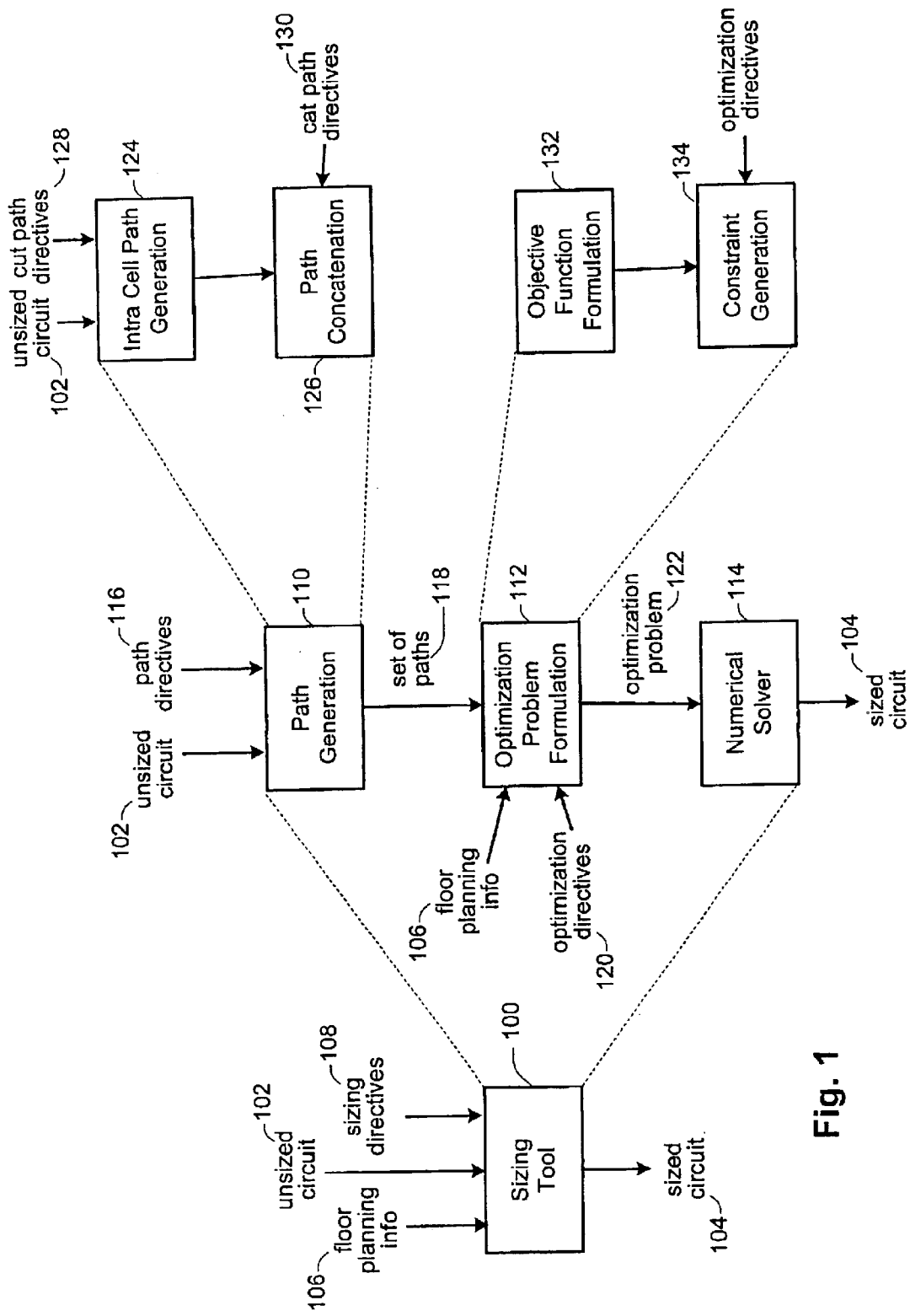
FIG. 1 is a simplified block diagram of a transistor sizing tool designed according to a specific embodiment of the present invention.

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In addition, well known process operations have not been described in detail in order not to unnecessarily obscure the present invention.

It should be noted that the embodiments of the invention described below have been implemented using Java in a Linux operating system platform. However, it will be understood that embodiments may be implemented using any of a wide variety of software languages and computing platforms without departing from the scope of the invention. For example, one could use C or C++ on a Windows or SUN OS platform.

It should also be noted that specific embodiments of the invention are described in the context of a design style relating to quasi-delay-insensitive asynchronous VLSI circuits. However it will be understood that many of the principles and techniques of the invention may be used in other contexts such as, for example, non-delay insensitive asynchronous VLSI as well as synchronous VLSI.

According to various specific embodiments, the asynchronous design style employed in conjunction with the invention is characterized by the latching of data in channels instead of registers. Such channels implement a FIFO (first-in-first-out) transfer of data from a sending circuit to a receiving circuit. Data wires run from the sender to the receiver, and an enable (i.e., an inverted sense of an acknowledge) wire goes backward for flow control. According to specific ones of these embodiments, a four-phase handshake between neighboring circuits (processes) implements a channel. The four phases are in order: 1) Sender waits for high enable, then sets data valid; 2) Receiver waits for valid data, then lowers enable; 3) Sender waits for low enable, then sets data neutral; and 4) Receiver waits for neutral data, then raises enable. It should be noted that the use of this handshake protocol is for illustrative purposes and that therefore the scope of the invention should not be so limited.

According to other aspects of this design style, data are encoded using 1ofN encoding or so-called "one hot encoding." This is a well known convention of selecting one of N+1 states with N wires. The channel is in its neutral state when all the wires are inactive. When the kth wire is active and all others are inactive, the channel is in its kth state. It is an error condition for more than one wire to be active at any given time. For example, in certain embodiments, the encoding of data is dual rail, also called 1of2. In this encoding, 2 wires (rails) are used to represent 2 valid states and a neutral state. According to other embodiments, larger integers are encoded by more wires, as in a 1of3 or 1of4 code. For much larger numbers, multiple 1ofN's may be used together with different numerical significance. For example, 32 bits can be represented by 32 1of2 codes or 16 1of4 codes.

According to other aspects of this design style, the design includes a collection of basic leaf cell components organized hierarchically. The leaf cells are the smallest components that operate on the data sent using the above asynchronous handshaking style and are based upon a set of design templates designed to have low latency and high throughput. Examples of such leaf cells are described in detail in "Pipelined Asynchronous Circuits" by A. M. Lines, *Caltech Computer Science Technical Report* CS-TR-95-21, Caltech, 1995, the entire disclosure of which is incorporated herein by reference for all purposes. These leaf cells include the Precharged-Half-Buffer Template, the Weak-Conditioned Half-Buffer Template, and the Precharged-Full-Buffer Template. They are all characterized by having one or two completion detection units, domino logic for the generation of data, and a small number of asynchronous control circuitry controlling when to pre-charge/evaluate the domino logic and when to assert/de-assert the acknowledgement of input channels.

One characteristic unique to this design style is that the cycle time of the design is largely fixed, e.g., 18 gate delays. If each gate delay has a unit-delay, the cycle time of any digitally-performance-optimized circuit designed using these templates will be dictated by cycles of gates, where each cycle generally contains the same number gates (e.g., 18). This makes the overall task of transistor-sizing very straight-forward, i.e., design each transistor such that no cycle of gates exceeds the desired speed target.

In some cases, the above-mentioned asynchronous design style may employ the pseudo-code language CSP (concurrent sequential processes) to describe high-level algorithms and circuit behavior. CSP is typically used in parallel programming software projects and in delay-insensitive VLSI. Applied to hardware processes, CSP is sometimes known as CHP (for Communicating Hardware Processes). For a description of this language, please refer to "Synthesis of Asynchronous VLSI Circuits," by A. J.

Martin, DARPA Order number 6202. 1991, the entirety of which is incorporated herein by reference for all purposes.

The transformation of CSP specifications to transistor level implementations for use with various techniques described herein may be achieved according to the techniques described in "Pipelined Asynchronous Circuits" by A. M. Lines, incorporated herein by reference above. However, it should be understood that any of a wide variety of asynchronous design techniques may also be used for this purpose.

A specific embodiment of the present invention provides a sizing tool that can handle loops, supports dynamic logic, and can independently size pull-up and pull-down networks in a hierarchical design flow with extensive re-use. As will become clear, this embodiment is particularly advantageous in relation to circuits designed according to the asynchronous design style described above. According to a specific implementation of this embodiment, gates along the same path are allowed to trade-off delay amongst each other, i.e., path-based delay budgeting. That is, according to such an embodiment, the sizing tool meets delay constraints for a given sequence of transitions rather than on a per transition basis, the delay through the sequence of transitions adding up to the same delay as if each of the transitions has a unit delay associated with it. This sizing tool can also independently size transistors driving rising and falling transitions, therefore increasing the solution space and producing better circuits. According to various embodiments, sizing tools designed according to the present invention also facilitate making tradeoffs between size, speed, and power consumption.

In a hierarchical design flow with extensive design re-use, path generation is particularly complex. This is because in such a hierarchical design flow many instance of cells with the same cell type are used. The transistor sizes are associated with transistors in a cell type and all instances of that cell type must share the same assignment of transistor sizes. This ensures the physical layout of the cell type can be re-used for each instance. For this reason, the computation of all paths that are important to each cell type must consider all different types of paths that relate to any transistor in the cell type. The paths must constrain the transistor sizes considering all the different instances in which the cell type is used and take into account the fact that different paths through this cell exist for different instances of its use.

At the same time, the path generation should not operate solely considering cell instances for two reasons. First, many cell instances share the same environment and thus the related paths are redundant with other cell instances. Second, the path generation must recognize that portions of different paths in different portions of the circuit cross instances of the same cell type to ensure that the transistor sizes within different instances of the same cell type are the same. Thus, it is important to consider all non-redundant paths considering all environments of a cell and ensure that the all such constraints are placed on the sizes of the transistors associated with each cell type. This type of path generation is not considered in any other known transistor-sizing tool. Path generation for digitally-performance-optimized asynchronous circuits designed according to the above-described design style amounts to breaking up all cycles into a set of paths that form the basis of the transistor sizing constraints needed to size the transistors in every leaf cell type.

In addition to providing path-based delay budgeting, a specific embodiment of the present invention allows the designer to size a circuit without regard to a test case that would define the critical paths in the circuit. That is, the circuit is sized to have effectively unit delay, i.e., to behave in one embodiment as if each gate has on average unit delay. This is in contrast to those tools that allocate the delay of each gate based on test cases that in some way provide a notion of the criticality of each gate. This sizing tool has a great deal of flexibility to optimize transistor/gate sizes as long as it doesn't change the observable performance characteristics of the circuit. This is advantageous in that it allows the designer to do all digital level simulations assuming unit delays, as well as all performance optimizations at the digital level. The sizing tool then enforces these optimizations at the analog level, determining the optimal devices sizes under those constraints. This approach avoids the difficult problem of devising a reasonable test case, and is thus more robust with regard to user error than approaches that require such a test case. This is particularly advantageous in the quasi-delay-insensitive design flow discussed above where by design most, if not, all the critical paths have the same number of digital transitions, i.e. gate delays.

A particular embodiment of the invention will now be described with reference to the accompanying figures. It will be understood that specific features described below are intended to illustrate details of the embodiment and should not be construed to limit the scope of the invention. Referring now to FIG. 1, sizing tool 100 is a tool for physical synthesis that includes a number of different algorithms. The primary input to the tool is an unsized representation of a circuit 102, e.g., a SPICE netlist in which the size of the transistors is as yet undetermined. The output of the tool is a sized representation of the same circuit 104, e.g., a SPICE transistor netlist in which the widths of all of the transistors are specified. Floor planning/geometry information 106 and a number of top level sizing directives 108 which control the various functionalities of the tool are also provided as input to the tool.

It should be noted that the unsized transistor level description which the sizing tool receives as its input may be in any of a variety of description languages similar to SPICE which may be generated using any of a variety of design flows, e.g., an asynchronous design flow, conventional synchronous place and route tools, synthesis tools, etc.

According to a specific embodiment, floor planning information 106 is initial physical layout information that includes the geometry of the layout, i.e., the relative position and size of all of the different blocks and cells, and specifically the wire lengths of the initial layout. As will be understood, the corresponding information in the output of the sizing tool may be used as floor planning information input for subsequent iterations. The nature of the user directives will be described in greater detail below.

Sizing tool 100 may be conceptually divided into three components, a path generation component 110, an optimization problem formulation component 112, and a numerical solver component 114. The path generation component 110 receives the unsized netlist 102 and a portion of the top-level directives 108 that we will refer to as path directives 116, and generates a set of paths 118. The optimization problem formulation component 112 receives the set of paths 118, the floor planning information 106, and a portion of the top-level directives 108 that we will refer to as optimization directives 120, and generates an optimization problem 122. The numerical solver 114 receives the optimization problem 122 and generates the sized netlist 104.

The path generation component 110 of the sizing tool may be further divided into two components, an intracell path generation component 124 and a path concatenation component 126. The intracell path generation component 124 receives the unsized netlist 102 and a subset of the path directives 116 that we will refer to as the "cut path" directives 128. The path concatenation component 126 receives the output of the intracell path generation component 124 and a subset of the path directives 116 that we will refer to as the "cat path" directives 130, and generates the set of paths 118.

The optimization problem formulation component 112 may also be further divided into two components, an objective function formulation component 132 and a constraint generation component 134. The constraint generation component receives the output of the objective function formulation component and the optimization directives 120 and generates the optimization problem 122. As an example, one optimization directive defines a tolerance that indicates when the optimization result has converged and the tool can terminate.

To achieve the path-based delay budgeting described above, paths within the circuit design are identified. Paths are defined as the circuitry between two observable points in the circuit. According to a specific embodiment, the total delay budget along an identified path is a unit delay, referred to as $\tau$, times the number of signal transitions along the path. And because the delay budget is shared among the devices in the path, certain devices, e.g., devices with high fan out, can be slower than others which will pick up the slack. Thus, the sized circuit may have improved energy consumption or area as compared to circuits sized with techniques assigning a unit delay to each device. For the asynchronous design style described above, this guarantees that digitally-performance-optimized circuits designed according that design style will have a cycle time of no worse than $\tau$ times the largest number of gates in any cycle.

According to a specific embodiment, the intracell path generation algorithm includes a default strategy for path generation using a depth first search in the portions of the transistor netlist corresponding to the "leaf" or lowest level cells of the design. According to a particular embodiment, such cells may have as many as a thousand transistors with the typical leaf cell having around fifty. Such a search involves a traverse from the input ports to the output ports of the cell to identify all possible paths through the cell. The intracell path generation algorithm creates default paths from the inputs of the leaf cell to its outputs and, in cases where a loop exists, cuts the path such that all of the paths generated are without loops. That is, where the search algorithm encounters a previously encountered segment, it terminates the path. The end points of each path are the observable points associated with the leaf cell. Thus, the observable points of a particular leaf cell include its input and output ports as well as the internal nodes at which such cuts were made. In one embodiment, the cut-path directive is a list of internal nodes which also should be observable, thereby giving the user more direct control of where paths will be cut.

In one specific embodiment, a path is redefined as a sequence of node-transition pairs and an observable point is defined as one such pair. This means that the paths can be identified with a sequence of half-operators, each responsible for pulling-up or pulling-down a node. For example, the pair (x,+) refers to the half-operator driving the node x high. As before, the path constraints require the paths to have amortized unit-delay. The benefit of this embodiment is that it allows the pull-up and pull-down transistors to be sized independently, increasing the solution space of the circuit, and enabling better circuits. Pseudo-code 200 representing an exemplary embodiment of an intracell path generation algorithm is illustrated in FIG. 2. In a particular embodiment, the cut-path directives allow the user to specify a node plus either falling or rising as observable. For convenience, a node alone can be listed as a cut-path directive as a short hand to making both the falling and rising transitions of that node observable.

Figure 3:
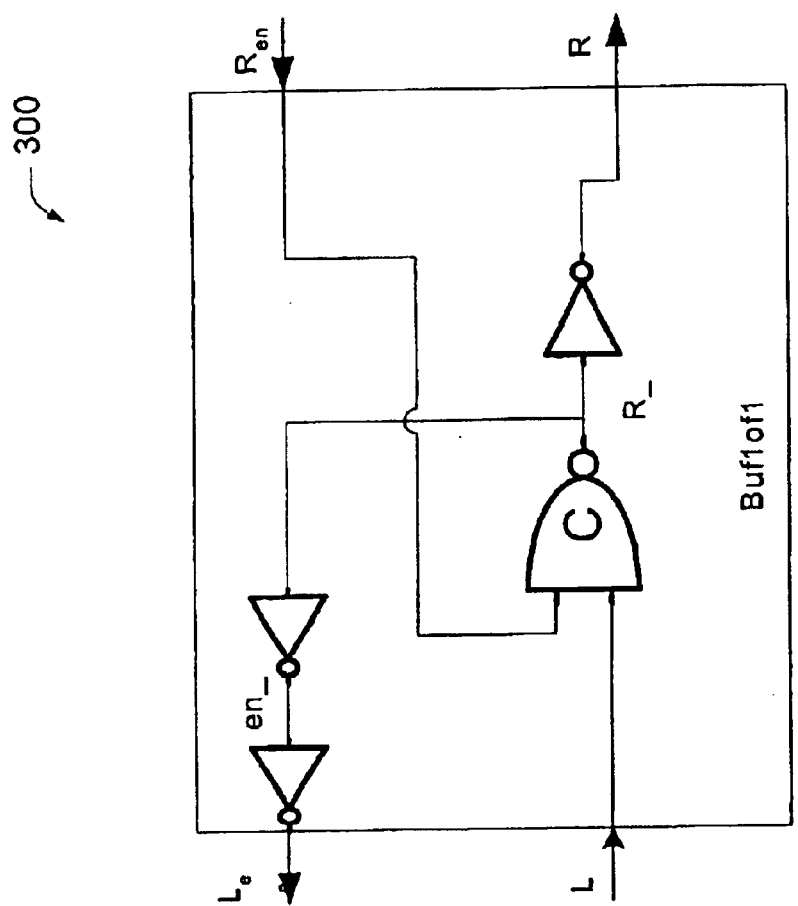
FIG. 3 is a gate level schematic of an exemplary cell for illustrating operation of an intracell path generation algorithm according to a specific embodiment of the invention.

As an example of the operation of such an intracell path generation algorithm, consider the gate-level description of a buf1of1 circuit 300 shown in FIG. 3. In this example, the set set 1 contains the single cell buf1of1 that is later assigned to the variable cella. The set of half-operators that will start a path are $\{(L,+), (L,-), (R_{en},+),(R_{en},-)\}$, where we denote a half-operator as a pair containing the node name and the direction that the node is driven. The first half-operator is a place holder and will not be used to size any transistors. The remaining half-operators are used to represent the set of transistors driving that node in that direction. For each of these half-operators, the function RecursivePaths is called with an empty set of half-operators lsta that make up the paths starting from the half-operator hoa.

As an example, consider the first call to RecursivePaths for the half-operator hoa assigned to (L,+). Within the foreach statement, the driven half-operator (R_,−) is found that has opposite direction of (L,+). This half-operator is added to the list and the new list is passed into a recursive call to RecursivePaths with (R_,−). Within this recursive call to subsequent half-operators are found (R,+) and (en_,+). Because (R,+) is an observable point, the code knows that the set of half-operators in 1st1 contains half-operators that make up a path that ends in (R,+). Based on this information it identifies and stores the sizing path that starts with (L,+) and ends in (R,+). Similarly, in the recursive call for (en_,+), the code will identify that (en_,+) drives the observable point ($L_{en}$,+) and create a path starting from (L,+) and ending in ($L_{en}$,+). This creates two sizing paths. Calls to the other four original half-operators form another 6 sizing paths, leading to the following 8 paths identified:

1) (L,+), (R_,−), (en_,+), ($L_{en}$,−)
2) (L,−), (R_,+), (en_,−), ($L_{en}$,+)
3) (L,+), (R_,−), (R,+)
4) (L,−), (R_,+), (R,−)
5) ($R_{en}$,+), (R_,−), (en_,+), ($L_{en}$,−)
6) ($R_{en}$,−), (R_,+), (en_,−), ($L_{en}$,+)
7) ($R_{en}$,+), (R_,−) (R,+).
8) ($R_{en}$,−), (R_,+) (R,−).

Note that in this example only transitions on ports are observable points and no cycles are found. Note, however, that the code checks when paths form a cycle and knows to break the cycle, avoiding an infinite loop.

In some cases, the paths identified by the intracell path generation algorithm are undesirably short. That is, in order to benefit from the flexibility afforded by path based delay budgeting, longer paths may be more desirable in some cases. Therefore, the path concatenation algorithm concatenates certain identified paths, i.e., removes the common observable points between the two paths, to create longer paths. Stated another way, a path is a list of transitions in sequence; a "cat" or concatenated path is a sequence of paths. According to a specific embodiment, path concatenation is done according to user-directives which specify that all transitions on ports between cells are to be considered unobservable points. The algorithm then concatenates all paths through such unobservable points. Pseudo-code 400 representing an exemplary path concatenation algorithm is shown in FIG. 4.

Figure 5:
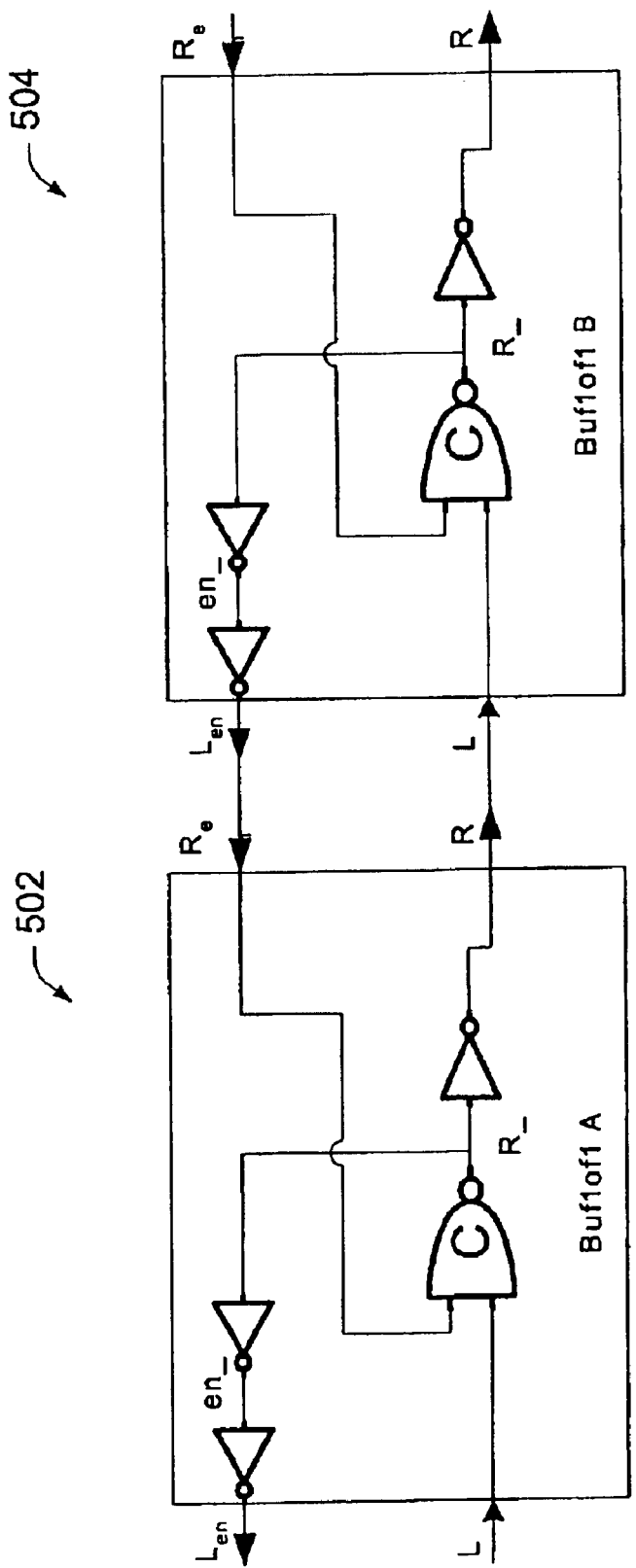
FIG. 5 is a gate level schematic of interconnected cells for illustrating operation of path concatenation algorithm according to a specific embodiment of the invention.

As an illustration of the operation of a path concatenation algorithm implemented according to the present invention, consider the example of two connected Buf1of1 circuits 502 and 504 as shown in FIG. 5. Let the notation A.x refer to a node x in Buf1of1 A, and B.x refer to a node x in Buf1of1 B. Consider the case when A.R and B.L are unobservable, and that because of this the paths through the nets are concatenated. The concatenated paths obtained using an algorithm represented by the pseudo-code of FIG. 4 include the following sequences of node-transition pairs:

1) (A.L,+), (A.R_,−), (A.en_,+), (A.L$_{en}$,−)
2) (A.L,−), (A.R_,+), (A.en_,−), (A.L$_{en}$,+)
3) (A.L,+), (A.R_,−), (A.R,+), (B.L,−), (B.R_,+), (B.R,−)
4) (A.L,−), (A.R_,+), (A.R,−), (B.L,+), (B.R_,−), (B.R,+)
5) (A.L,+), (A.R_,−), (A.R,+), (B.L,−), (B.R_,+), (B.en_,−), (B.L$_{en}$,+)
6) (A.L,−), (A.R_,+), (A.R,−), (B.L,+), (B.R_,−), (B.en_,+), (B.L$_{en}$,−)
7) (A.R$_{en}$,+), (A.R_,−), (A.en_,+), (A.L$_{en}$,−)
8) (A.R$_{en}$,−), (A.R_,+), (A.en_,−), (A.L$_{en}$,+)
9) (A.R$_{en}$,+), (A.R_,−), (A.R,+), (B.L,−), (B.R_,+), (B.R,−)
10) (A.R$_{en}$,−), (A.R_,+), (A.R,−), (B.L,+), (B.R_,−), (B.R,+)
11) (A.R$_{en}$,+), (A.R_,−), (A.R,+), (B.L,−), (B.R,+), (B.en_,−), (B.L$_{en}$,+)
12) (A.R$_{en}$,−), (A.R_,+), (A.R,−), (B.L,+), (B.R,−), (B.en_,+), (B.L$_{en}$,−)
13) (B.R$_{en}$,+), (B.R_,−), (B.en_,+), (B.L$_{en}$,−)
14) (B.R$_{en}$,−), (B.R_,+), (B.en_,−), (B.L$_{en}$,+)
15) (B.R$_{en}$,+), (B.R_,−), (B.R,+)
16) (B.R$_{en}$,−), (B.R_,+), (B.R,−)

The operation of the algorithm in FIG. 4 is as follows. The CatPathGeneration is called, set 1 containing only a single mid-level cell that in this case contains the two Buf1of1 circuits. This single mid-level cell is assigned to the variable cella. First the sizing paths for both Buf1of1 subcells are "popped-up" to the mid-level cell. This amounts to properly annotating each half-operator in the sizing path with the sub-cell instance it belongs to within the mid-level cell. Then, the paths that will start cat-paths are identified. These are the paths that start at observable points of the mid-level cell. In this case, these are the paths that with Buf1of1A.L and Buf1of1B.R$_{en}$. These two paths are added to the variable seta.

For each of these paths, we use a similar function to RecursivePaths called RecursiveCatPaths to identify the set of paths starting from these paths that can make up cat-paths and drive observable points and make cat-paths from them. As an example, consider the call to RecursiveCatPaths with the path starting with (Buf1of1A.L,+) and ending with (Buf1of1A.R,+). The foreach clause identifes that this path drives two other paths that start with (Buf1of1B.L,+) that in turn are assigned to the variable patha. For each such path, the code recursively calls RecursiveCatPaths. In the recursive call for the path that ends in (Buf1of1B.R,+), the code identifies it drives an observable point and makes a catpath including the pair of sizing paths. In the recursive call for the path that ends in (Buf1of1B.Len+) drives an observable point and creates a catpath including this pair of sizing paths.

Note also that the code has a case where the cat-paths forms cycles and knows to break the cycles, avoiding an infinite loop.

As mentioned above, the intracell path generation and path concatenation algorithms employ different portions of the user defined path directives to identify/cut paths and concatenate paths, respectively. That is, the intracell path generation algorithm employs the cut path directives to govern its behavior, and the path concatenation algorithm employs the cat path directives to govern its behavior. According to a specific embodiment, the intracell path generation algorithm and the path concatenation algorithm are provided as separate algorithms to take advantage of the fact that the typical circuit design includes a number of instances of particular cell types. Thus, the intracell path generation results for a particular type of cell can be applied to all instances of that cell type in any number of different parent types.

Referring back to FIG. 1, once the set of paths 118 is generated, the objective function formulation algorithm 132 generates an objective function that is a measure of energy and/or area. More specifically and according to various embodiments, energy in this context corresponds to a weighted function of all the transistor sizes. According to a particular embodiment, the weights are derived from the number of times a particular transistor is used in the circuit. According to alternative embodiments, the weights can also be derived with reference to the expected number of transitions on a given transistor. As will be understood, there is a correlation between the latter and the former. However, in some circuits, e.g., asynchronous circuits, the correlation may not be particularly strong as certain portions of such a design may only be executed infrequently. According to still further embodiments, the weights may be derived from some combination of both of these factors as well as a variety of other factors.

On the other hand, the number of times a particular transistor is used in a circuit correlates quite well with the overall area dedicated to that type of transistor, i.e., if the size of the transistor can be reduced the impact on the overall circuit area will be proportional to the number of instances of that transistor. Such an approach does not take wiring area into account, but is nevertheless a good approximation.

In addition to the variables which control the sizes of the individual transistors in the gates that make up the leaf cells of the circuit, a delay model is needed which approximates the delay through these gates. This delay model includes a gate delay model, which corresponds to the delay through the gate itself, and a wire delay model that corresponds to the delay through the wire driven by the gate. The delay model is applied to the leaf cell paths to generate a delay for each path as a function of the widths of the associated transistors. This delay is then stored as a constraint that must be met for the corresponding path.

Thus, the optimization problem becomes minimizing the objective function, i.e., energy/area, of independent variables subject to all of the path constraints. This may be done with any of a variety of conventional numerical solvers.

In one specific embodiment, the optimization problem given to the numerical solver uses hard delay constraints. This means that the solver will try to minimize energy given delay constraints that all must be satisfied. Consequently, for some circuits with nodes that have high fanout or high resistance due to long wires, the optimization problem may have no solution. The embodiment returns information to the user identifying which paths prevented the solver from achieving a set of transistors which satisfies the delay constraints. This enables the circuit designer to make circuit optimizations after which sizing is re-run.

In another embodiment, the delay constraints are soft. This can be done by incorporating the difference between delays and their constraints into the objective function and minimizing the amount that the paths delays are larger than their associated constraints.

A particular embodiment of the invention employs an operator delay model that represents a transistor as a resistor and solves for the delay of an RC network. According to a more specific embodiment, the operator delay model defines a gate as including a pull-up half operator and a pull-down half operator connected at the node of interest. Two constraints for each path are generated, one for each transition, i.e., low-to-high and high-to-low. The corresponding half operator is modeled as a resistor, the load on the node is modeled as a capacitor, and the intervening wire is modeled using a wire $\pi$ model.

Figure 6:
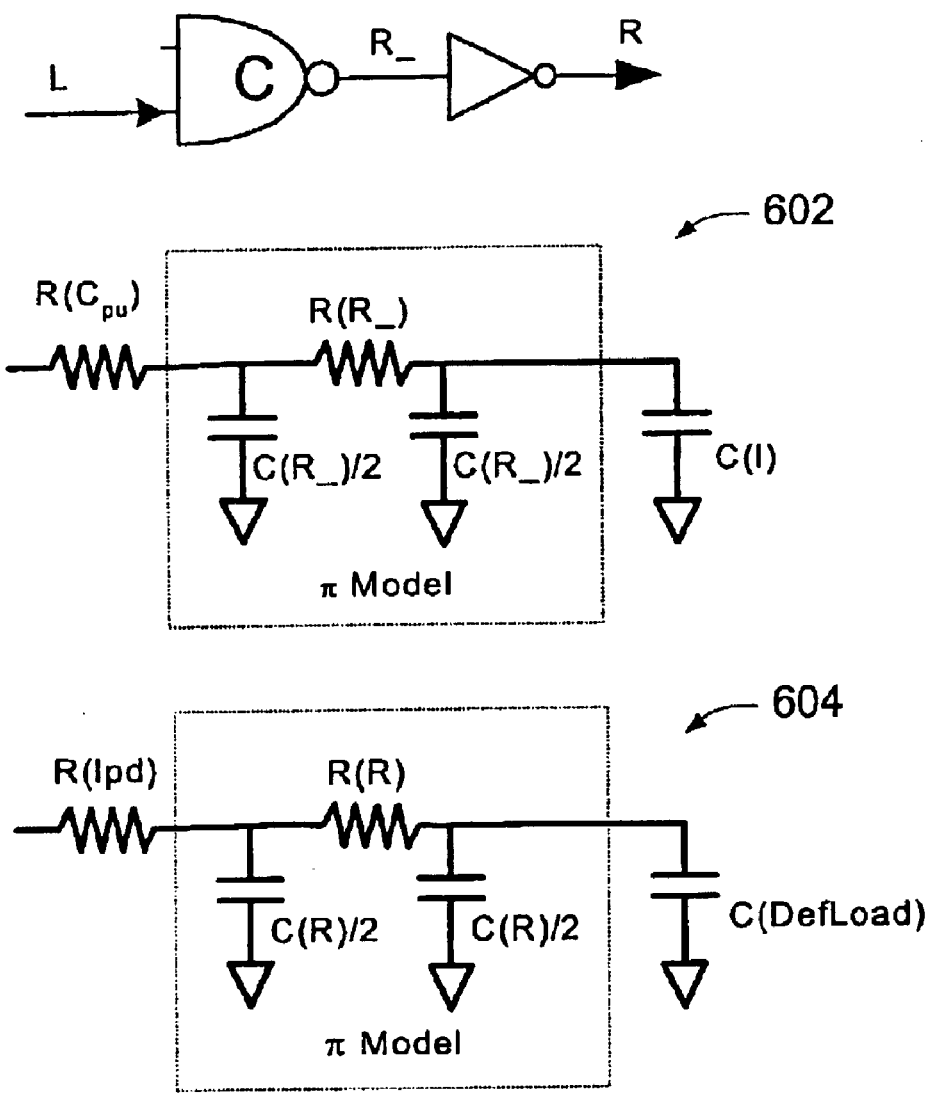
FIG. 6 includes schematics illustrating pull up and pull down half operator representations of a circuit path according to a delay model used with various embodiments of the present invention.

As an example, consider the path L, R__, R in the circuit illustrated in FIG. 3. The Mueller consensus element (C-element) gate driving R__ may be represented by a pull-up half-operator and pull-down half-operator, each of which has an associated function for resistance in terms of the width of the associated transistors. Let these functions be denoted $R(C_{pu})$ and $R(C_{pd})$, respectively. Similarly, let the functions for pull-up and pull-down half-operator resistances for the inverter gate in the path be denoted $R(I_{pu})$ and $R(I_{pd})$, respectively. The wires R__ and R have $\pi$ models associated with their resistance and capacitance and let the wire R have an additional default capacitance C(R) associated with it that models potential fanouts. Consequently, each transition in the path has an associated RC network from which a symbolic expression of delay is defined. As an example, the RC networks 602 and 604 for the rising transition of R__ and the falling transition of R are shown in FIG. 6.

There are two path constraints associated with each path, one modeling the rising transition at the output (end of the path) and one modeling the falling transition at the output. These path constraints constrain the sum of the delay associated with the related RC networks to be less than the delay budget defined as a function of $\tau$. According to a specific embodiment, the path constraints for a cell take into account all instances of that cell and that different instances will have different wire delays and load capacitance on its output ports. Consequently, the path constraints model the worst-case delay on the path defined to be the maximum delay in any of the cell instance environments.

According to one embodiment, the resistor expressions for the gates are obtained using a simple table look-up in which parameters of the expression are associated with transistor stack size. For example, a particular gate might have a maximum stack height of three transistors. The table can have a constant parameter which when multiplied by the transistor widths represents the overall resistances. The delay is thus a function of this constant parameter and the transistor variables. The value of the capacitance in the delay model relates to the capacitance of the circuitry being driven by the node between the half operators. The wire model employs the wire length data from the floor planning/ geometry information to obtain the appropriate wire delay component.

The wire model is an estimation of the total capacitance and resistance of the net. According to a specific embodiment, the capacitance is derived from the total wire length of a net connecting many half-operators. This total wire length is generated using a "half the perimeter of the bounding box" approximation algorithm. Such an algorithm defines a bounding box having two devices to be interconnected on diagonally opposite corners. The bounding box having multiple devices is the smallest box that includes all devices. The total wire length connecting these devices is then estimated to be half the distance around the perimeter of the bounding box. Capacitance of the net is then a function of the total wire length and can take into account the estimated side-wall capacitance associated with neighboring wires. This turns out to be give a much better approximation than conventional sizing techniques that do not use hierarchical floor planning information. The resistance of the wire can also be derived from the total wire length. In another specific embodiment, however, the resistance of the net can be estimated to be the maximum of the resistances between any driver and any sink on the net. The resistances between any driver and any sink can be derived using half-the-perimeter of bounding boxes including just the driver and sink or some combination of this distance and half the perimeter of the larger bounding box that includes all drivers and sinks. One such combination is a weighted linear combination that is parameterized by yet another user directive, but other well-known combinations are also possible.

The delay of the resulting RC network is then determined using, for example, classic Elmore delay calculations. According to a specific embodiment, these calculations may be modified by taking into account resistive shielding, i.e., the extent to which resistors "shield" the circuit from associated capacitances. The user may introduce the value(s) that effectively model resistive shielding as one or more of the optimization directives. So, for example, for wire lengths exceeding a particular threshold, a resistive shielding factor of less than one can be introduced into the calculation to prevent an overestimation of the delay. According to a more specific embodiment, different resistive shielding factors may be provided for different wire lengths.

According to one embodiment, the above described operator delay model may apply to all of the fanouts for the node involved. According to various alternative embodiments, more complicated models could be constructed which separately model each fan out. This results in a more accurate delay model, which, in turn, better allows the designer to meet delay constraints with small transistor sizes. For example, this approach is much more accurate than approaches which use estimations of wire lengths based on the total number of gates which need to be placed, and/or only have a limited number of discrete transistor widths available for use. According to various embodiments of the invention, the nature of the floor planning information input to the sizing tool facilitates these efficiencies.

According to a specific embodiment, the floor planning information provided to the sizing tool is hierarchical in nature. That is, the leaf cells discussed above are the lowest level primitives within a design, i.e., the ones containing transistor level circuitry. There are also typically several higher levels of cells which include various combinations of lower level cells (including leaf cells), and which have associated floor-planning information that is also characterized by a relatively high level of accuracy. That is, because the information is hierarchical, the positions of the leaf cells in higher level cells (and thus across all levels of the design) are more precisely known and therefore the accuracy of the wire lengths provided in the floor planning information is greater.

Thus, the ability to reuse highly accurate primitives on each level of a design that are based on highly accurate lower level primitives (down to the leaf cells), results in a highly accurate and efficient layout. This may be contrasted with conventional techniques, e.g., place and route, which, in addition to the inaccurate wire length estimates discussed above, typically employ flat layouts having a large number of relatively small primitives.

Place and route techniques also suffer from the drawback that they are difficult to iterate with. That is, when the designer employing a place and route tool makes a minor change to the circuit, e.g., to the size of a gate, the resulting layout may have moved the gate to a completely different place in the design. In many cases, this is just like starting over. By contrast, the hierarchical floor planning information employed by the present invention results in a relatively stable layout which allows the designer to make minor changes without dramatically affecting the current layout. In other words, the design flow is more convergent and typically requires fewer iterations than conventional flows.

According to a specific embodiment, each of the leaf cells employed by the present invention is significantly larger than the lowest level primitives associated with many conventional techniques. According to one embodiment, instead of the conventional 4 to 10 transistors in a typical primitive, e.g., a NAND gate, leaf cells of the present invention may have 50 to 1000 transistors. According to an even more specific embodiment, the transistors within a given leaf cell may be (more or less) arbitrarily placed and the wire length estimations within the cell are made using a "half the perimeter of the bounding box" approximation. According to alternative embodiments, any of a variety of other wire estimation techniques may be employed including, for example, spanning trees, Steiner trees, Manhattan Steiner trees, etc.

Implicit in the discussion above is the fact that the designer is trying to identify the "best" circuit given some external design constraint. For example, given a fixed power budget, the designer may want to identify the fastest speed at which the circuit can run. Alternatively, given a fixed speed of operation, the designer may want to determine the lowest power dissipation that can be achieved. Thus, according to a particular embodiment of the invention, a metric that is representative of the overall performance of the circuit is the expression that is optimized by the sizing tool. More specifically, an expression that incorporates energy dissipation and cycle time, e.g., $e\tau^2$, is employed as that metric. It will be understood that any of a wide variety of mathematical combinations of these two parameters may be employed for this purpose. However, the expression $e\tau^2$ is particularly suited to design styles in which circuits are designed to operate over a wide range of supply voltages because it exhibits relative immunity to changes in supply voltage.

Thus, for example, iterations of the sizing technique of the present invention may be run on a given design for different values of $\tau$, i.e., the delay constraints, to determine the minimum energy consumption, i.e., e. Alternatively, a desired value for $e\tau^2$ may be built into the tool.

While the invention has been particularly shown and described with reference to specific embodiments thereof, it will be understood by those skilled in the art that changes in the form and details of the disclosed embodiments may be made without departing from the spirit or scope of the invention. For example, the processes described herein and the resulting circuits may be represented (without limitation) in software (object code or machine code), in varying stages of compilation, as one or more netlists, in a simulation language, in a hardware description language, by a set of semiconductor processing masks, and as partially or completely realized semiconductor devices. The various alternatives for each of the foregoing as understood by those of skill in the art are also within the scope of the invention. For example, the various types of computer-readable media, software languages (e.g., Verilog, VHDL), simulatable representations (e.g., SPICE netlist), semiconductor processes (e.g., CMOS, GaAs, SiGe, etc.), and device types (e.g., FPGAs) suitable for using in conjunction with the processes described herein are within the scope of the invention.

Finally, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A computer-implemented method for facilitating physical synthesis of an integrated circuit design, the method comprising:

generating a set of paths between observable nodes in a netlist representing the circuit design, each path corresponding to a sequence of signal transitions; and sizing transistors represented in the netlist to attempt to meet a delay constraint for each path, the delay constraint corresponding to an average unit delay times the number of signal transitions in the corresponding path, a plurality of individual delays of different durations being allocated among the transitions for at least one of the paths to meet the delay constraint, at least one of the individual delays exceeding the average unit delay.

2. The method of claim 1 wherein the netlist comprises an unsized netlist in which the transistors do not have specified sizes.

3. The method of claim 1 wherein the netlist comprises a previously sized netlist in which the transistors have specified sizes from a previous sizing iteration.

4. The method of claim 1 wherein the netlist includes representations of a plurality of leaf cells each having at least one input port and at least one output port, and wherein generating the set of paths comprises traversing each leaf cell from the input to output ports to identify at least one of the paths associated therewith, the at least one input port and the at least one output port for the leaf cells corresponding to selected ones of the observable nodes.

5. Th method of claim 4 wherein traversing ach leaf cell comprises cutting a path within the leaf cell at a cut node corresponding to a previously encountered path, the cut node corresponding to one of the observable nodes.

6. The method of claim 5 wherein cutting the path is done according to user-defined directives.

7. The method of claim 1 wherein the signal transitions include a rising transition and a falling transition for each node in the corresponding path, each rising transition being effected by a corresponding pull up half operator, and each falling transition being effected by a corresponding pull down half-operator, and wherein sizing the transiston comprises sizing selected ones of the transistors associated with the pull up and pull down half operators for selected nodes independently.

8. The method of claim 1 wherein generating the set of paths comprises concatenating selected ones of the paths.

9. The method of claim 8 wherein concatenating the selected paths is done according to user-defined directives.

10. The method of claim 8 wherein the netlist includes representations of a plurality of leaf cells, and wherein concatenating the selected paths comprises removing one of the observable nodes between two of the leaf cells.

11. The method of claim 1 wherein the netlist includes representations of a plurality of leaf cells, and wherein generating the set of paths comprises generating path results for a first instance of a particular leaf cell type, and applying the path results for the first instance of the particular leaf cell type to at least one other instance of the particular leaf cell type.

12. The method of claim 1 wherein sizing the transistors comprises minimizing an objective function subject to the delay constraints, the objective function relating to the average unit delay and a measure of energy consumption.

13. The method of claim 12 further comprising running multiple iterations of the sizing of the transistors for different values of the average unit delay.

14. The method of claim 12 wherein the delay constraints comprise hard constraints, and where minimizing the objective function does not meet all delay constraints, the method further comprises identifying selected ones of the paths for which the delay constraints could not be met.

15. The method of claim 12 wherein the delay constraints comprise soft constraints, and where minimizing the objective function does not meet all delay constraints, the method further comprises minimizing actual path delays relative to the corresponding delay constraints.

16. The method of claim 12 wherein the objective function is proportional to the measure of energy consumption and the square of the average unit delay.

17. The method of claim 1 wherein pairs of the signal transitions for each path correspond to a gate which is represented by a pull up half operator and a pull down half operator connected at a node, and wherein each of the individual delays of different durations are determined with reference to a delay model for each of the pull up and pull down half operators for each of the gates in each path, and wires between the nodes.

18. The method of claim 17 wherein the delay model represents each half operator as a resistor, a load on the corresponding node as a capacitor, and a wire connecting the half operator and the load as a wire $\pi$ model.

19. The method of claim 18 wherein a value for the resistor is determined with reference to a transistor stack size associated with each half operator.

20. The method of claim 18 wherein a value of the capacitance is determined wit reference to the capacitance of the load.

21. The method of claim 18 wherein the wire $\pi$ model employs wire length data derived from actual geometry information corresponding to the circuit design.

22. The method of claim 21 wherein the wire length data are generated using a half-the-perimeter-of-the-bounding-box algorithm.

23. The method of claim 18 further comprising employing Elmore delay calculations to determine each of the individual delays.

24. The method of claim 23 wherein the Elmore delay calculations account for resistive shielding.

25. The method of claim 1 wherein the individual delays are determined with reference to wire length data derived from actual geometry information corresponding to the circuit design.

26. The method of claim 25 wherein sizing the transistors results in generation of at least one leaf cell primitive, multiple instances of which may be employed in the physical synthesis of the integrated circuit design.

27. The method of claim 26 further comprising storing the at least one leaf cell primitive in a library of cells for use in subsequent integrated circuit designs.

28. The method of claim 1 wherein sizing the transistors results in a sized netlist, the method further comprising fabricating an integrated circuit corresponding to the integrated circuit design using the sized netlist.

29. An integrated circuit designed according to the method of claim 1.

30. At least one computer readable medium having data structures stored therein representing a sized netlist generated according to the method of claim 1.

31. A set of semiconductor processing masks generated using a sized netlist generated according to the method of claim 1.

32. At least one computer-readable medium having computer program instructions stored therein which are operable to perform the method of claim 1.

33. An electronic system comprising at least one intergrated circuit designed according to the method of claim 1.

34. A computer-implemented method for facilitating physical synthesis of integrated circuit designs, the method comprising:

generating a netlist representing an asynchronous circuit design characterized by transmission of signals according to an asynchronous handshake protocol;

generating a set of paths between observable nodes in the netlist, each path having a first number of signal transitions; and sizing transistors represented in the netliut to attempt to meet a delay constraint for each path, the delay constraint corresponding to an average unit delay times the first number, a plurality of individual delays of different durations being allocated among the transitions for at least one of the paths to meet the delay constraint, at least one of the individual delays exceeding the average unit delay.

35. The method of claim 34 wherein the netlint comprises an unsized netlist in which the transistors do not have specified sizes.

36. The method of claim 34 wherein the netlist comprises a previously sized netlist in which the transistors have specified sizes from a previous sizing iteration.

37. the method of claim 34 wherein the netlist includes representations of a plurality of leaf coils each having at least one input port and at least one output port, and wherein generating the act of paths comprises traversing each leaf cell from the input to output ports to identify at least one of the paths asociated therewith, the at least one input port and the at least one output port for the leaf cells corresponding to selected ones of the observable nodes.

38. The method of claim 37 wherein traversing each leaf cell comprises cutting a path within the leaf cell at a cut node corresponding to a previously encountered path, the cut node corresponding to one of the observable nodes.

39. The method of claim 38 wherein cutting the path is done according to user-defined directives.

40. The method of claim 34 wherein the signal transitions include a rising transition and a falling transition for each node in the corresponding path, each rising transition being effected by a corresponding pull up half operator, and each falling transition being effected by a corresponding pull down half operator, and wherein sizing the transistors comprises sizing selected ones of the transistors associated with the pull up and pull down half operators for selected nodes independently.

41. The method of claim 40 wherein selected ones of the paths comprise dynamic logic.

42. The method of claim 40 wherein selected ones of the paths comprise cyclic loops of gates which do not include a latch.

43. The method of claim 34 wherein generating the set of paths comprises concatenating selected ones of the paths.

44. The method of claim 43 wherein concatenating the selected paths is done according to user-defined directives.

45. The method of claim 43 wherein the netlist includes representations of a plurality of leaf cells, and wherein concatenating the selected paths comprises removing one of the observable nodes between two of the leaf cells.

46. The method of claim 34 wherein the netlist includes representations of a plurality of leaf cells, and wherein generating the set of paths comprises generating path results for a first instance of a particular leaf cell type, and applying the path results for the first instance of the particular leaf cell type to at least one other instance of the particular leaf cell type.

47. The method of claim 34 wherein sizing the transistors comprises minimizing an objective function subject to the delay constraints, the objective function relating to the average unit delay and a measure of energy consumption.

48. The method of claim 47 further comprising running multiple iterations of the sizing of the transistors for different values of the average unit delay.

49. The method of claim 47 wherein the delay constraints comprise hard constraints, and where minimizing the objective function does not meet all delay constraints, the method further comprises identifying selected ones of the paths for which the delay constraints could not be met.

50. The method of claim 47 wherein the delay constraints comprise soft constraints, and where minimizing the objective function does not meet all delay constraints, the method further comprises minimizing actual path delays relative to the corresponding delay constraints.

51. The method of claim 47 wherein the objective function is proportional to the measure of energy consumption and the square of the average unit delay.

52. The method of claim 34 wherein pairs of the signal transitions for each path correspond to a gate which is represented by a pull up half operator and a pull down half operator connected at a node, and wherein each of the individual delays of different durations are determined with reference to a delay model for each of the pullup and pull down half operators for each of the gates in each path, and wires between the nodes.

53. The method of claim 52 wherein the delay model represents each half operator as a resistor, a load on the corresponding node as a capacitor, and a wire connecting the half operator and the load as a wire $\pi$ model.

54. The method of claim 53 wherein a value for the resistor is determined with reference to a transistor stack size associated with each half operator.

55. The method of claim 53 wherein a value of the capacitance is determined with reference to the capacitance of the load.

56. The method of claim 53 wherein the wire $\pi$ model employs wire length data derived from actual geometry information corresponding to the circuit design.

57. The method of claim 56 wherein the wire length data are generated using a half-the-perimeter-of-the-bounding-box algorithm.

58. The method of claim 53 further comprising employing Elmore delay calculation, to determine each of the individual delays.

59. The method of claim 58 wherein the Elmore delay calculations account for resistive shielding.

60. The method of claim 34 wherein the individual delays are determined with reference to wire length data derived from actual geometry information corresponding to the circuit design.

61. The method of claim 60 wherein sizing the transistors results in generation of at least one leaf cell primitive, multiple instances of which may be employed in the physical synthesis of the integrated circuit design.

62. The method of claim 61 further comprising storing the at least one leaf cell primitive in a library of cells for use in subsequent integrated circuit designs.

63. The method of claim 34 wherein sizing the transistors results in a sized netlist, the method further comprising fabricating an integrated circuit corresponding to the integrated circuit design using the sized netlist.

64. The method of claim 34 wherein the asynchronous circuit design is hierarchical.

65. The method of claim 64 wherein the asynchronous handshake protocol between a first sender and a first receiver in the asynchronous circuit design comprises:

the first sender sets a data signal valid when an enable signal from the fast receiver goes high;

the first receiver lowers the enable signal upon receiving the valid data signal;

the first sender sets the data signal neutral upon receiving the low enable signal; and the first receiver raises the enable signal upon receiving the neutral data signal; and wherein the hierarchical asynchronous circuit design includes dynamic logic and cyclic loops of gates.

66. An integrated circuit designed according to the method of claim 34.

67. At least one computer readable medium having data structures stored therein representing a sized netlist generated according to the method of claim 34.

68. A set of semiconductor processing masks generated using a sized netlist generated according to the method of claim 34.

69. At least one computer-readable medium having computer program instructions stored therein which are operable to perform the method of claim 34.

70. An electronic system comprising at least one integrated circuit designed according to the method of claim 34.

71. A computer-implemented method for facilitating physical synthesis of integrated circuit designs, the method comprising:

generating a netlist representing an asynchronous circuit design characterized by transmission of signals according to an asynchronous handshake protocol;

generating a set of paths from the netlist, each path corresponding to a sequence of nodes each having upward and downward signal transitions associated therewith;

for each of selected nodes, representing the corresponding upward transition by a pull up half operator and the corresponding downward transition by a pull down half operator and sizing transistors represented in the netlist to attempt to meet a delay constraint for each path, first selected transistors associated with the pull up half operator for each selected node being sized independently from second selected transistors associated with the corresponding pull down half operator.

72. The method of claim 71 wherein sizing the transistors to attempt to meet the delay constraint for each path comprises determining a total delay for the path with reference to a delay model for each of the pull up and pull down half operators in the path, and wires between the nodes.

73. The method of claim 72 wherein the delay constraint for each path corresponds to an average unit delay times the number of signal transitions in the path, and wherein sizing the transistors comprises allocating a plurality of individual delays of different durations among the transitions of a first path to meet the delay constraint, at least one of the individual delays exceeding the average unit delay.

74. The method of claim 72 wherein sizing the transistors comprises ensuring that individual delays corresponding to each of the transitions of a first path are less than or equal to an average unit delay.

75. The method of claim 72 wherein the delay model represents each half operator as a resistor, a load on the corresponding node as a capacitor, and a wire connecting the half operator and the load as a wire $\pi$ model.

76. The method of claim 75 wherein a value for the resistor is determined with reference to a transitor stack size associated with each half operator.

77. The method of claim 75 wherein a value of the capacitance is determined with reference to the capacitance of the load.

78. The method of claim 75 wherein the wire $\pi$ model employs wire length data derived from actual geometry information corresponding to the circuit design.

79. The method of claim 78 wherein the wire length data are generated using a half-the-perimeter-of-the-bounding box algorithm.

80. The method of claim 75 further comprising employing Elmore delay calculations to determine individual delays associated with each half operator.

81. The method of claim 80 wherein the Elmore delay calculations account for resistive shielding.

82. The method of claim 71 wherein sizing the transistors comprises minimizing an objective function subject to the delay constraints, the objective function relating to an average unit delay and a measure of energy consumption.

83. The method of claim 82 further comprising running multiple iterations of the sizing of the transistors for different values of the average unit delay.

84. The method of claim 82 wherein the delay constraints comprise hard constraints, and where minimizing the objective function does not meet all delay constraints, the method further comprises identifying selected ones of the paths for which the delay constraints could not be met.

85. The method of claim 82 the delay constraints comprise soft constraints, and where minimizing the objective function does not meet all delay constraints, the method further comprises minimizing actual path delays relative to the corresponding delay consutraints.

86. The method of claim 82 wherein the objective function is proportional to the measure of energy consumption and the square of the average unit delay.

87. The method of claim 71 wherein sizing the transistors comprises determining individual delays for the transitions of each path with reference to wire length data derived from actual geometry information corresponding to the circuit design.

88. The method of claim 87 wherein sizing the transistors results in generation of at least one leaf cell primitive, multiple instances of which may be employed in the physical synthesis of the integrated circuit design.

89. The method of claim 88 further comprising storing the at least one leaf cell primitive in a library of cells for use in subsequent integrated circuit designs.

90. The method of claim 71 wherein sizing the transistors results in a sized netlist, the method further comprising fabricating an integrated circuit corresponding to the integrated circuit design using the sized netlist.

91. The method of claim 71 wherein selected ones of the paths comprise dynamic logic.

92. The method of claim 71 wherein selected ones of the paths comprise cyclic loops of gates which do not include a latch.

93. The method of claim 71 wherein the asynchronous circuit design is hierarchical.

94. The method of claim 93 wherein the asynchronous handshake protocol between a first sender and a first receiver in the asynchronous circuit design comprises:

the first sender sets a data signal valid when an enable signal from the first receiver goes high;

the first receiver lowers the enable signal upon receiving the valid data signal;

the first sender sets the data signal neutral upon receiving the low enable signal; and the first receiver raises the enable signal upon receiving the neutral data signal; and wherein the hierarchical asynchronous circuit design includes dynamic logic and cyclic loops of gates.

95. An integrated circuit designed according to the method of claim 71.

96. At least one computer readable medium having data structures stored therein representing a sized netlist generated according to the method of claim 71.

97. A set of semiconductor processing masks generated using a sized netlist generated according to the method of claim 71.

98. At least one computer-readable medium having computer program instructions stored therein which are operable to perform the method of claim 71.

99. An electronic system comprising at least one integrated circuit designed according to the method of claim 71.

* * * * *